United States Patent
Yoshida et al.

(10) Patent No.: US 7,454,649 B2
(45) Date of Patent: Nov. 18, 2008

(54) MARGINLESS STATUS DETERMINATION CIRCUIT

(75) Inventors: Kenji Yoshida, Kawasaki (JP);
Yoshihiko Koike, Kawasaki (JP);
Tetsuya Yoshida, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 366 days.

(21) Appl. No.: 11/238,957

(22) Filed: Sep. 30, 2005

(65) Prior Publication Data

US 2006/0208745 A1   Sep. 21, 2006

(30) Foreign Application Priority Data

Mar. 17, 2005   (JP) .............................. 2005-076961

(51) Int. Cl.
*G06F 1/00* (2006.01)
(52) U.S. Cl. .................. 713/500; 714/699; 714/700
(58) Field of Classification Search ................ 713/500; 675/354; 714/700, 699
See application file for complete search history.

(56) References Cited

U.S. PATENT DOCUMENTS

| | | | | |
|---|---|---|---|---|
| 5,870,404 A | * | 2/1999 | Ferraiolo et al. | 714/700 |
| 6,178,332 B1 | * | 1/2001 | Norman et al. | 455/502 |
| 6,247,138 B1 | * | 6/2001 | Tamura et al. | 713/600 |
| 6,249,445 B1 | * | 6/2001 | Sugasawa | 363/60 |
| 2001/0013111 A1 | * | 8/2001 | Bishop et al. | 714/724 |

FOREIGN PATENT DOCUMENTS

JP   3-251912   11/1991

* cited by examiner

*Primary Examiner*—Thomas Lee
*Assistant Examiner*—Jaweed A Abbaszadeh
(74) *Attorney, Agent, or Firm*—Staas & Halsey LLP

(57) ABSTRACT

By including a unit for storing data to be determined, a unit for delaying the data, a unit for storing the output of the delay unit, and a unit for comparing the storage contents of the data before the delay with the storage contents of the data after the delay, and outputting a marginless status detection signal when they are different, the presence/absence of a margin is monitored regardless of ambient conditions by using an output marginless status detection signal as a switch control signal for a clock switch circuit, thereby operating electronic equipment without changing a frequency of a clock signal up to the critical condition.

11 Claims, 23 Drawing Sheets

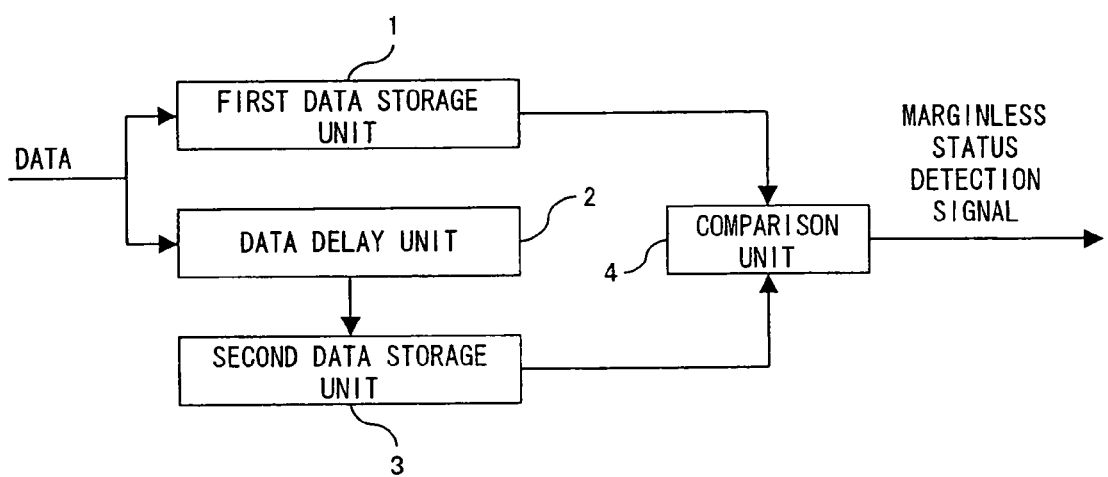
F I G. 1

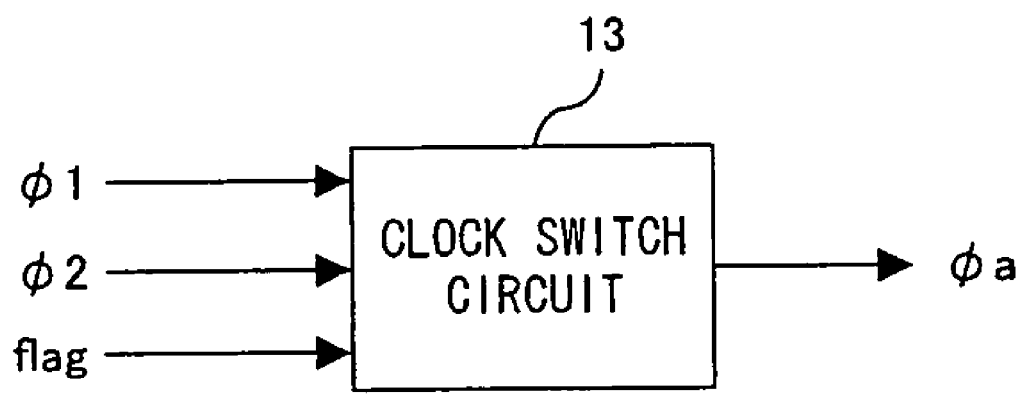
F I G. 4

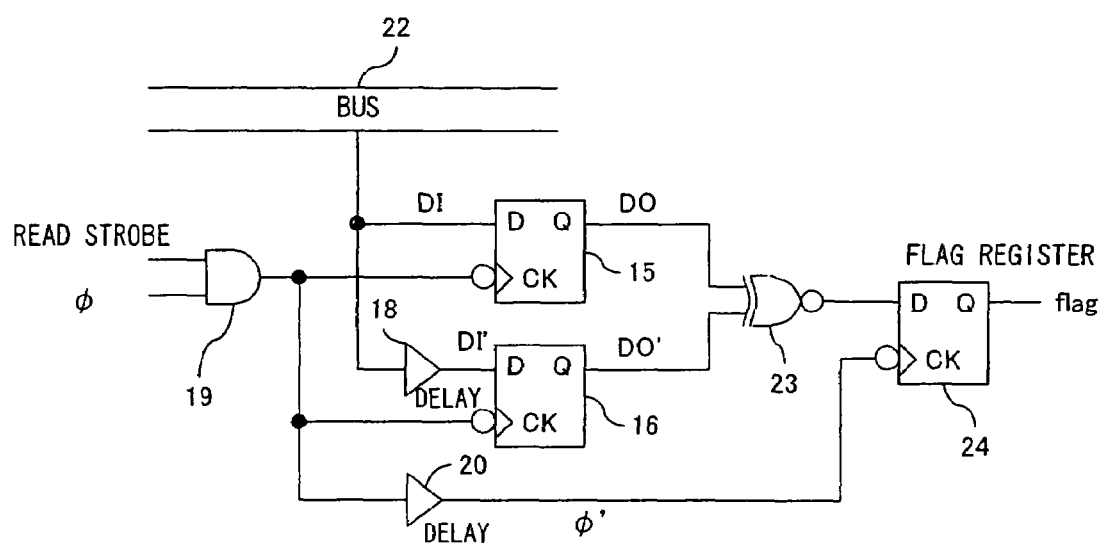
F I G. 5

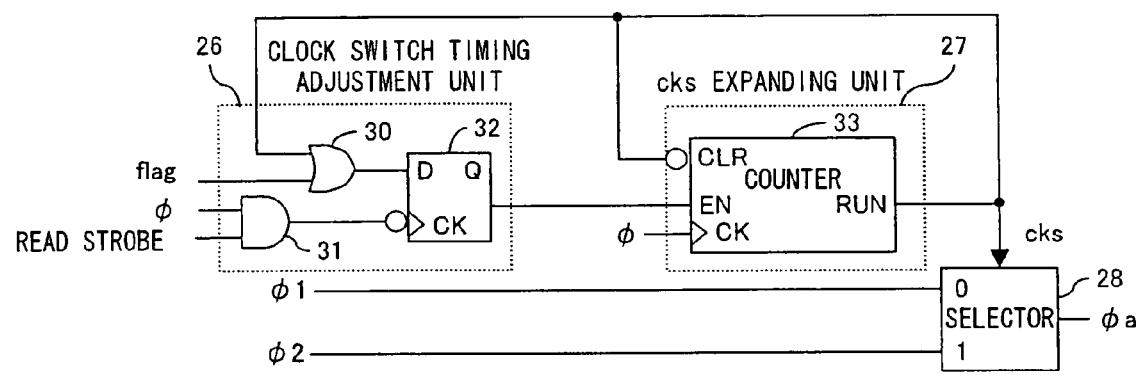
F I G. 7

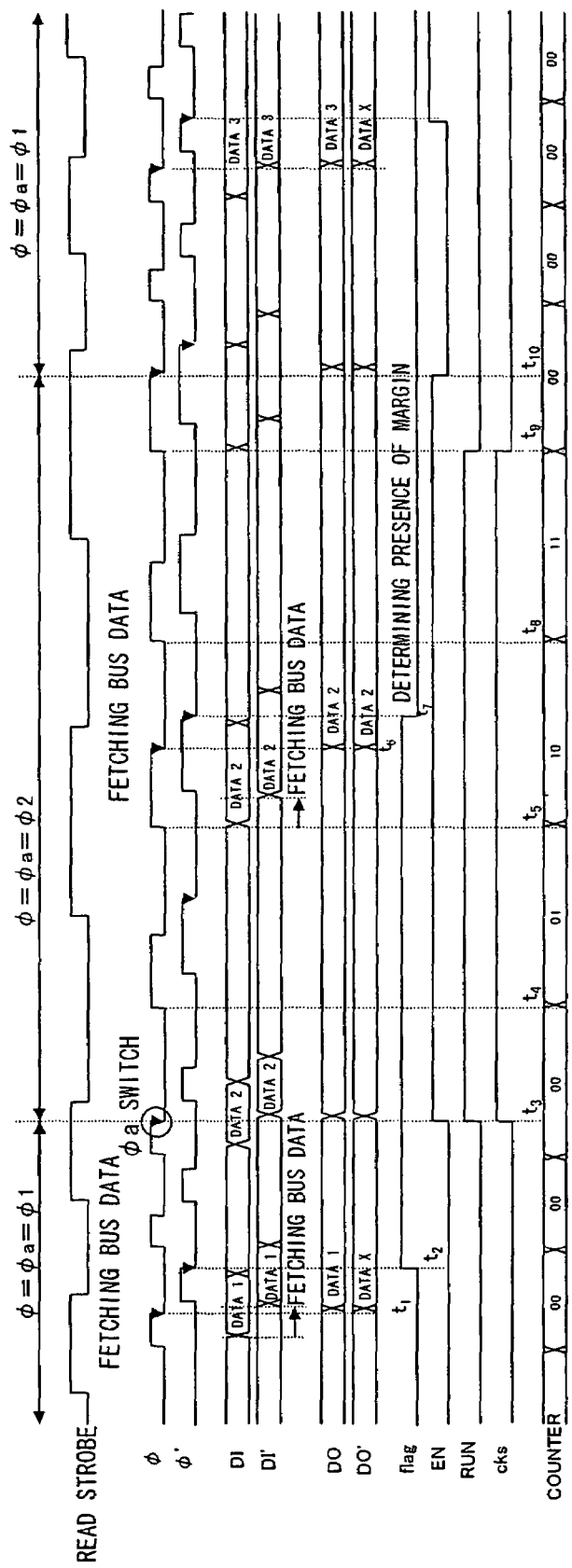
F I G. 8

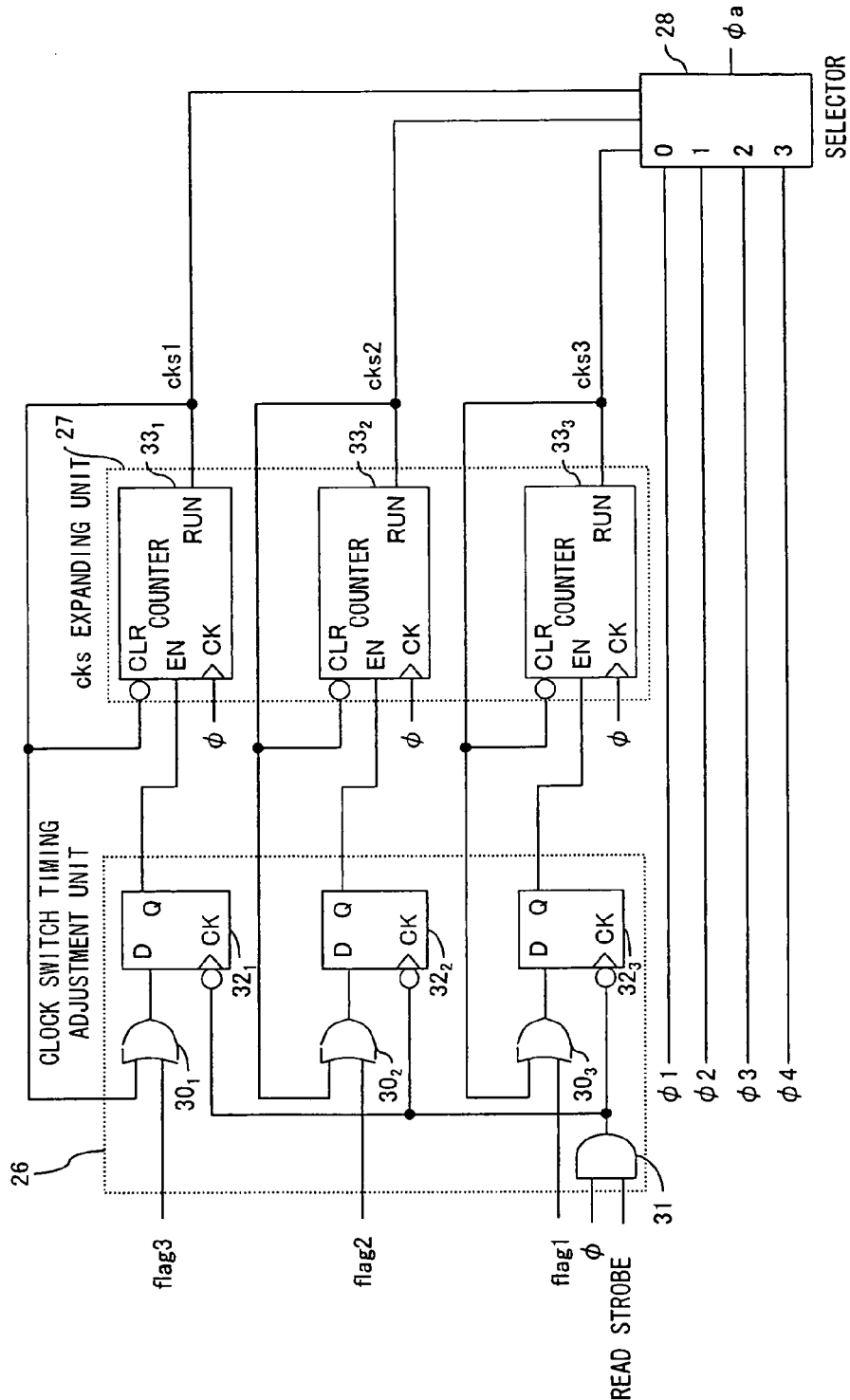
F I G. 10

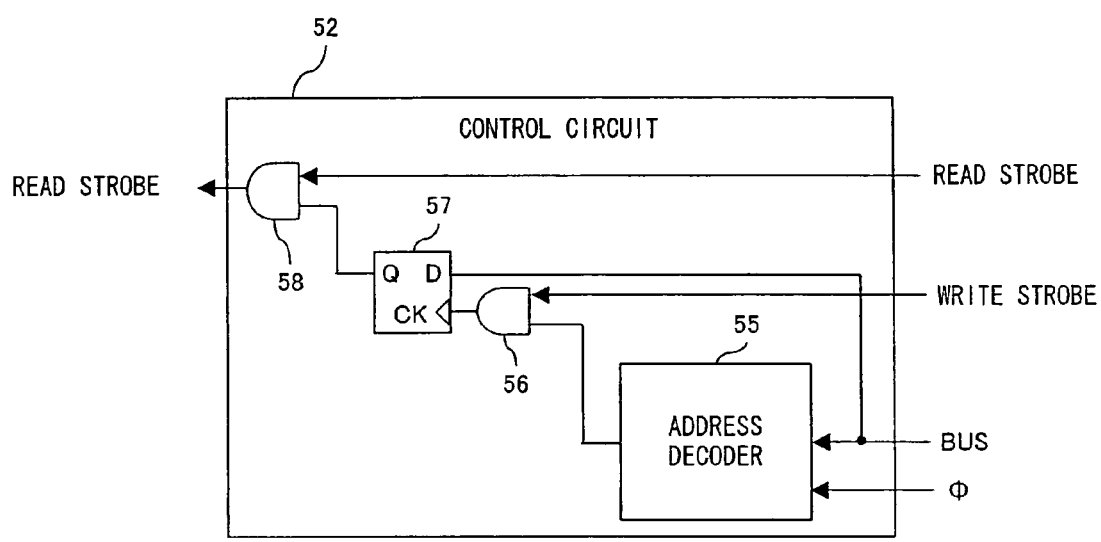
F I G. 17

MARGINLESS STATUS DETERMINATION CIRCUIT

CROSS-REFERENCE TO RELATED APPLICATIONS

This application is based upon and claims the benefit of priority from the prior JAPANESE Patent Application No. 2005-076961 filed on Mar. 17, 2005, the entire contents of which are incorporated herein by reference.

BACKGROUND OF THE INVENTION

1. Field of the Invention

The present invention relates to a system of determining a data delay margin in electronic equipment operating in synchronization with a system clock (machine clock), and more specifically to a marginless status determination circuit for determining a marginless status for a case in which a data delay margin is reduced corresponding to, for example, a change in temperature.

1. Description of the Related Art

Generally, the operation of electronic equipment such as a microcomputer, etc. is subject to environment conditions, for example, a change in temperature, etc., the operation margin decreases as the temperature rises, and in the most extreme case an error such as a malfunction, run away, etc. occurs.

Therefore, generally in designing electronic equipment, the worst value is assumed as an environment condition for using the electronic equipment, and a timing margin is assigned to perform a normal operation even under the worst condition. In this case, it is necessary to set in advance a temperature at which a marginless status is assumed to occur. Since the severest condition in the environment conditions of shipping a product, for example, the severe ambient temperature is set, a margin normally remains at the actually applied temperature. That is, the overly severe condition is set.

Described below is a document of the prior art which introduces a conventional technology for guaranteeing both performance and reliability of electronic equipment in response to a change in the above-mentioned ambient temperature.

The patent document 1 described below discloses the technology of electronic equipment operating in synchronization with a system clock switching the frequency of a system clock by selecting any of a plurality of clock signals having different frequencies depending on the detection result of an ambient temperature.

However, in the patent document 1, a clock frequency is switched when an ambient temperature reaches a predetermined temperature. Therefore, the problem that it is difficult to set a switching temperature cannot be solved. Furthermore, since a temperature sensor and an A/D converter for conversion of a detected temperature to digital data are required, the area of a circuit undesirably increases.

[Patent Document 1] Japanese Published Patent Application No. Hei 3-251912 "Electronic Equipment Having Function Of Switching System Clock"

SUMMARY OF THE INVENTION

The present invention aims at monitoring the presence/absence of a margin regardless of an ambient temperature, enabling electronic equipment to operate without changing an operation condition up to the critical condition, and preventing the increase of the area of a circuit.

The present invention includes a unit for storing data to be determined, a unit for delaying the data, a unit for storing the output of the delay unit, and a unit for comparing the storage contents of the data before the delay with the storage contents of the data after the delay, and outputting a marginless status detection signal when they are different. The output marginless status detection signal is used as a switch control signal for the clock switch circuit.

According to the present invention, it can be constantly monitored whether or not there is a margin for the delay of data without detection of a temperature using a temperature sensor or an A/D converter with the electronic equipment operated up to the critical condition of a margin.

BRIEF DESCRIPTION OF THE DRAWINGS

FIG. 1 is a block diagram of the configuration showing the principle of the marginless status determination circuit according to the present invention;

FIG. 4 is an explanatory view showing the operation of the clock switch circuit shown in FIG. 2;

FIG. 5 is a block diagram of the configuration of the marginless status determination circuit according to a first embodiment of the present invention;

FIG. 7 is a block diagram of the configuration of the clock switch circuit according to the second embodiment of the present invention;

FIG. 8 is a time chart of an example of a marginless status determining operation according to the second embodiment of the present invention;

FIG. 10 is a block diagram of the configuration of the clock switch circuit according to the third embodiment of the present invention;

FIG. 17 is a block diagram of the configuration of the control circuit according to the fifth embodiment of the present invention;

DESCRIPTION OF THE PREFERRED EMBODIMENTS

Figure 2:
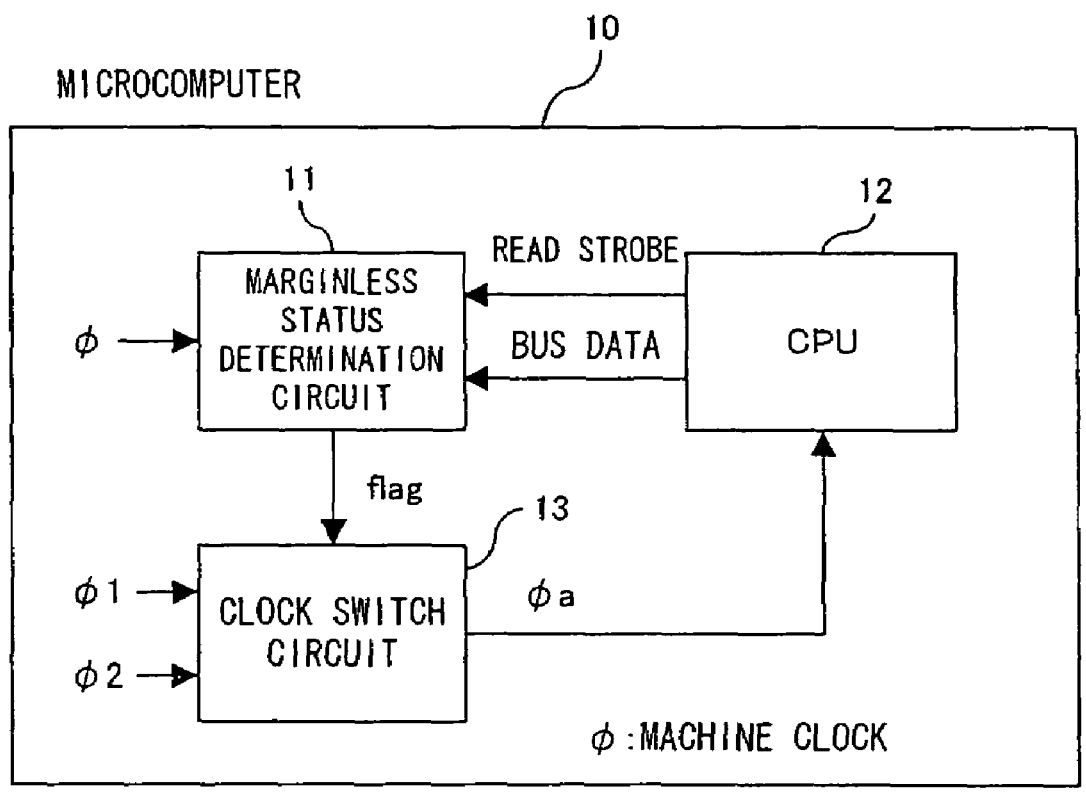
FIG. 2 is a block diagram of the basic configuration of the marginless status determination system according to an embodiment of the present invention.

FIG. 1 is a block diagram of the configuration showing the principle of the marginless status determination circuit according to the present invention. The marginless status determination circuit according to the present invention determines the presence/absence of a margin of a data delay, and basically receives data to be determined and, for example, a read and/or write strobe signal of the data to be determined, and outputs a control signal for switch a clock when the determination result is a "marginless status".

In FIG. 1, a first data storage unit 1 stores data to be determined, for example, bus data. A data delay unit 2 delays the data by a predetermined time. A second data storage unit 3 stores the output of the data delay unit 2. A comparison unit 4 compares the storage contents of the first data storage unit 1 with the storage contents of the second data storage unit 3, and outputs a marginless status detection signal when they do not match. The marginless status detection signal output by the comparison unit 4 is used as a switch control signal for the clock switch circuit for switching a plurality of clock signal having different frequencies.

An embodiment of the present invention can further comprise a counter unit for indicating the recovery to the clock before the switch for the clock switch circuit after a predetermined time when a clock switch circuit switches a clock for the output of the marginless status detection signal from the comparison unit 4.

In an embodiment of the present invention, the marginless status determination circuit can operate during the data read of a computer, and in FIG. 1, the data provided for the first data storage unit 1 and the data delay unit 2 can be the read data on the bus. Otherwise, the marginless status determination circuit can operate also when data is stored in the computer, and the data to be determined can be the write data on the bus.

Also in an embodiment of the present invention, the marginless status determination circuit can operate when data is read and when data is stored in a computer, and the data to be determined can be read data or write data on a bus.

An embodiment of the present invention can further comprise a control circuit for controlling for the marginless status determination circuit the start/stop of the marginless status determining operation in response to an external indication, for example, an indication from a user, and the control circuit can be incorporated into the central processing device of a microcomputer. Furthermore, the control circuit can instructs the central processing device of a microcomputer to start the marginless status determining operation depending on the input of the signal indicating that the PLL oscillation circuit for providing a high frequency signal has selected the highest multiple rate.

Furthermore, in an embodiment of the present invention, the system clock switched by the clock switch circuit can be provided for the peripheral circuit of the central processing device of a microcomputer.

The marginless status determination circuit according to the present invention further comprises a data storage unit for storing data to be determined, a plurality of data delay units for delaying the data by different delay times, a plurality of delay data storage unit s for storing each of the output of the plurality of data delay units, a plurality of comparison units for outputting a nonmatching detection signal when storage contents of the plurality of delay data storage units are compared with storage contents of the data storage unit and they are different, and a clock switch unit for switching clock signals having different frequencies corresponding to the value of the nonmatching detection signal output from each of the plurality of comparison units.

In an embodiment of the present invention, the clock switch unit can stepwise switch different clock signals, for example, from high frequencies to low frequencies corresponding to the nonmatching detection signals output from a plurality of comparison units.

As described above, according to the present invention, data to be determined and a strobe signal of read and/or write of the data to be determined are received, the storage result of the data to be determined is compared with the storage result obtained by delaying the data, and it is determined that a marginless status has been detected when they are different, and a control signal is output to switch a clock.

Before the detailed explanation about the embodiments of the present invention, the marginless status determination and the clock switch system according to the present invention are roughly described below by referring to FIGS. 2 through 4. FIG. 2 is a block diagram of the basic configuration of the marginless status determination system in which a marginless status determination circuit independent of the CPU is provided in a microcomputer 10. In FIG. 2, a marginless status determination circuit 11 is provided independent of a CPU 12 in the microcomputer 10, and the CPU 12 supplies a read strobe signal and bus data to the marginless status determination circuit 11.

The marginless status determination circuit 11 further determines using a machine clock signal φ whether or not there is a delay margin for the bus data. If it is determined that a marginless status is detected, a flag indicating it is output to a clock switch circuit 13. In response to the flag, the clock switch circuit 13 normally switches one of a plurality of, for example, two clock signals φ1 and φ2, and provides the result of the switch for the CPU 12 as φa. The machine clock φ provided for the marginless status determination circuit 11 and the clock signal φa provided for the CPU 12 indicate, for example, the same clock.

Figure 3:
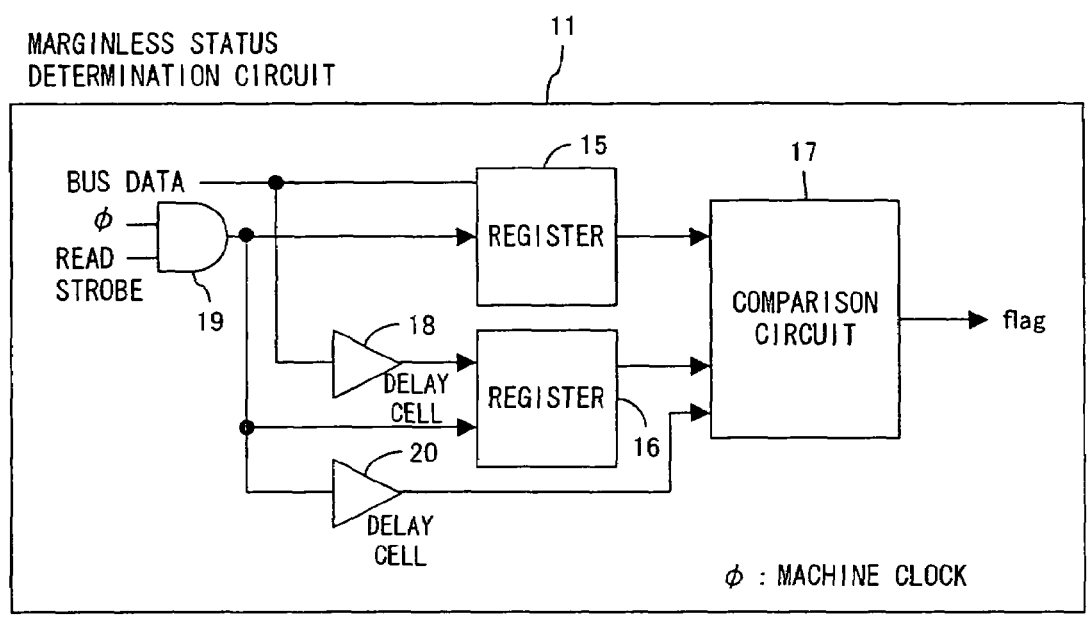
FIG. 3 is a block diagram of the configuration of the marginless status determination circuit shown in FIG. 2.

FIG. 3 is a block diagram of the basic configuration of the marginless status determination circuit 11 shown in FIG. 2. In FIG. 3, the marginless status determination circuit 11 comprises a register 15 for receiving bus data as is, a register 16 for receiving a delay result by a delay cell 18 of the bus data, a comparison circuit 17 for comparing the contents between the register 15 and the register 16, an AND gate 19 for providing a clock input for fetching data to the registers 15 and 16, and a delay cell 20 for delaying the output of the AND gate 19 and provides a clock as a comparison timing for the comparison circuit 17. The read strobe signal supplied from the CPU 12 as shown in FIG. 2 and a machine clock signal ϕ are input to the AND gate 19. The operation of the marginless status determination circuit 11 is described below in detail by referring to FIGS. 5 and 6.

According to claim 1 of the present invention, the first and second data storage units respectively correspond to the registers 15 and 16, the data delay unit corresponds to the delay cell 18, and the comparison unit corresponds to the comparison circuit 17.

FIG. 4 is an explanatory view of the clock switch circuit 13 shown in FIG. 2. To the clock switch circuit 13, a flag output by the comparison circuit 17 and a plurality of clock signals having different frequencies, that is, two clock signals ϕ1 and ϕ2 in this example, are input, and outputs ϕ1 or ϕ2 to the CPU 12 as a clock signal ϕa depending on the value of the flag.

Described below further in detail are the embodiments of the present invention. FIG. 5 is a block diagram of the configuration of the marginless status determination circuit according to a first embodiment of the present invention. When FIG. 5 is compared with the view of the basic configuration shown in FIG. 3, it comprises an EXNOR gate 23 corresponding to the comparison circuit 17, and a flag register 24. The registers 15 and 16 are configured by, for example, D-FF, that is, D latches. The output of the D latches 15 and 16 is input to the EXNOR gate 23, the output of the EXNOR gate 23 is supplied to the flag register 24, and the output of the delay cell 20 is used as the clock input to the flag register 24.

In FIG. 5, the output of the AND gate 19 to which a read strobe signal and a machine clock ϕ are input is supplied, as in the case of FIG. 3, as clock input to the D latches 15 and 16. Similarly, the output of the AND gate 19 is provided for the clock input of the flag register 24 as a clock signal ϕ' delayed by the delay cell 20. The operations of these D latches 15 and 16 and the flag register 24 are negative edge trigger type operations. They operate at the falling edge of the clock input, and the data supplied to the data input D is fetched to the register at its fall timing.

Figure 6:
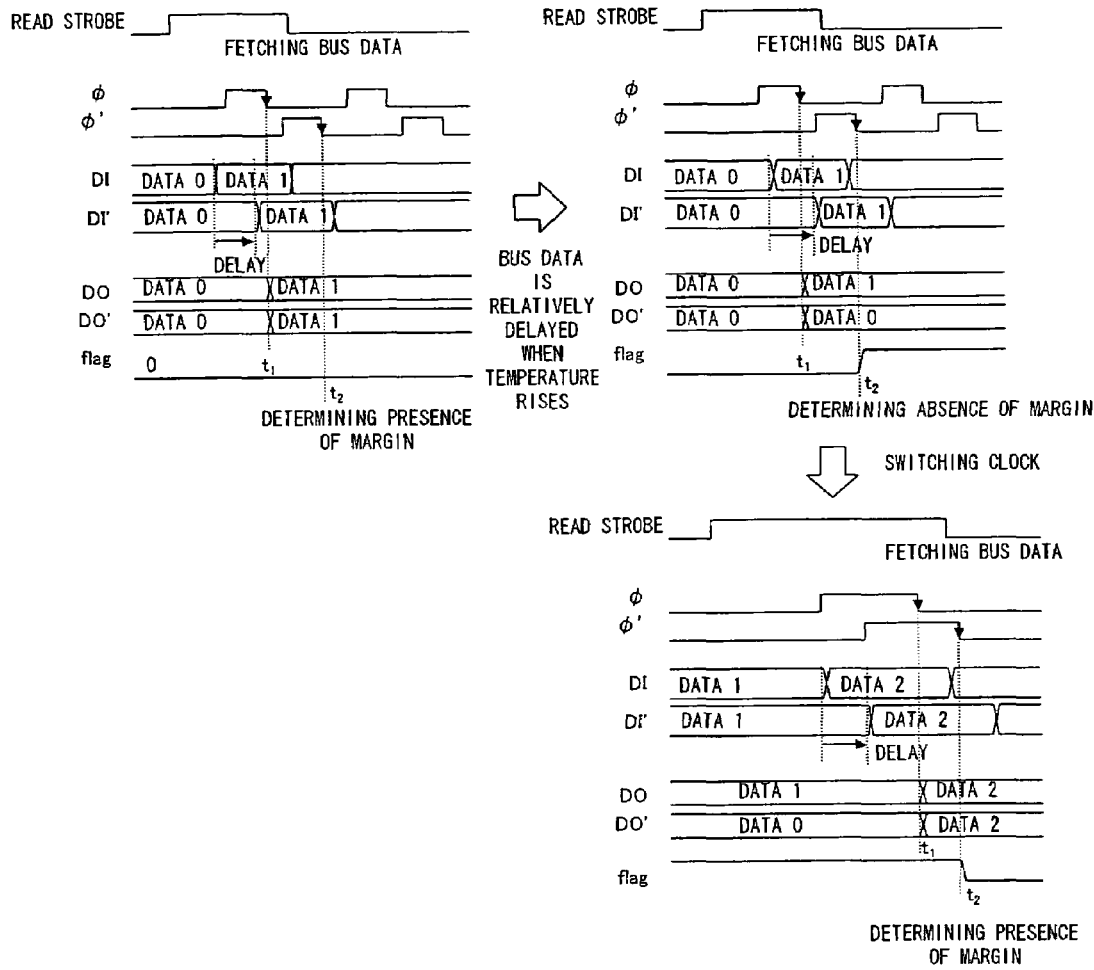
FIG. 6 is a time chart of an example of a marginless status determining operation according to the first embodiment of the present invention.

FIG. 6 is a time chart of an example of a marginless status determining operation according to the first embodiment of the present invention. In FIG. 6, the time chart on the left shows an example of the determination as the presence of a margin. In FIG. 6, data is fetched to the registers 15 and 16 when the read strobe signal is in an H state, and the machine clock ϕ indicates its falling time $t=t_1$. At this time, data 1 is fetched to the register 15. The delaying operation is performed on the register 16 by the delay cell 18. However, in this case, the fetched data is the data 1, and the same data is fetched to the registers 15 and 16. Therefore, the output of the EXNOR gate 23 is in an L state, and the data fetched to the flag register 24 at the falling edge is in the L state, and the value of the flag also indicates L.

The time chart at the upper right of FIG. 6 is an example of a determination of the absence of a margin. When this example is compared with the left view of FIG. 6, the timing of the data 1 on a bus 22 is further delayed based on the time at which the read strobe signal enters the H state. Therefore, the data input to the register 16 at the bus data fetch time $t=t_1$, that is, DI', is data 0, and is different from the data 1 fetched to the register 15. Therefore, the output of the EXNOR gate 23 is the H state, and the value of the flag at the falling time $t=t_2$ of the clock ϕ' is H, thereby determining a marginless status.

The lower right view of FIG. 6 is a time chart of the operation after the machine clock is switched to a signal of a lower frequency after a marginless status is determined in the upper right view in FIG. 6. By switching a machine clock to a clock signal of a lower frequency, not only the width of a clock pulse, but also the width of a corresponding read strobe pulse becomes wider. As a result, the data fetched to the registers 15 and 16 at the time $t=t_1$, are data 2. Therefore, it is determined that there is a margin at the time $t=t_2$, and the value of a flag is L.

FIG. 7 is a block diagram of the configuration of the clock switch circuit according to the second embodiment of the present invention. The clock switch circuit according to the second embodiment is determined to be in a marginless status in the marginless status determination circuit, the value of the flag is H, and after the clock is switched, a marginless status determining operation is performed. After the presence of a margin is determined and the value of the flag is L, it is considered that the ambient temperature changes again and a marginless status is entered, the original clock can be regained at a certain time after the flag indicates L. Thus, the clock switch system is designed.

In FIG. 7, the clock switch circuit comprises a clock switch timing adjustment unit 26, a cks (clock select) expanding unit 27, and a selector 28. The clock switch timing adjustment unit 26 is configured by an OR gate 30, an AND gate 31, and a D latch 32, and the cks expanding unit 27 is configured by a counter 33.

To the OR gate 30, a cks (clock select) signal which is provided for selector 28 and a flag output from the marginless status determination circuit are input, and the output is provided for the data input terminal of the D latch 32. To the AND gate 31, a read strobe signal and a machine clock ϕ are supplied, and the output of the AND gate 31 is supplied to the clock input terminal (negative edge operation) of the D latch 32.

The output of the D latch 32 is provided for the count enable (EN) terminal of the counter 33 configuring the cks expanding unit 27, and the cks signal is provided as the output (RUN) of the counter 33 for the clear (CLR) input terminal (negative logic), a machine clock ϕ is provided for the clock input terminal. Furthermore, the selector 28 outputs ϕ1 when the cks signal is "0", and ϕ2 when it is "1" as a clock signal ϕa. The clock ϕ2 is assumed to have a lower frequency than the clock ϕ1.

In the clock switch circuit shown in FIG. 7, when the value of the edge flag is H, in synchronization with the negative edge of the machine clock ϕ in the period of H of the subsequent read strobe signal, H is latched as data in the D latch 32, and the output Q of the D latch 32 is provided as a count enable signal EN for the counter 33. At this time, the output RUN of the counter 33 is H. As a result, the ϕa as the output of the selector 28 is ϕ2. When the counter 33 counts a predetermined value and an overflow occurs, the value of RUN becomes L. As a result, the counter 33 is cleared so that the clock ϕa can be prevented from returning to the original clock ϕ1 until the count value of the counter 33 overflows although the flag becomes H, the clock is switched to ϕ2, and then the value of the flag becomes L.

The operation of the clock switch circuit shown in FIG. 7 is further explained by referring to the time chart showing an example of an operation shown in Fig. 8. In FIG. 8, the value of the first flag is L, and it is assumed that ϕ1 is output as a clock ϕa by the selector 28. At time $t_1$, data is fetched to the two registers in the marginless status determination circuit. At time $t_2$, a marginless status determination is made, it is determined that a marginless status is detected, and the value of the flag becomes H. Afterwards, at the falling edge of the machine clock ϕ in the period of H of the read strobe signal, the machine clock is switched to ϕ2. At the time $t_3$, the signals EN, RUN, and cks indicate the H state. Then, the counter 33 starts counting, and at the rising edge ($t_4$), the count value of the counter 33 becomes "01". The data X indicates an inconstant value.

Then, at time $t_5$, the count value becomes "10". At time $t_6$, bus data is fetched. At time $t_7$, a marginless status determination is made, it is determined that the presence of a margin is detected, and the value of a flag becomes L. Then, at time $t_8$, the count value becomes "11". At time to, the counter overflows, the signals RUN and cks become "0", and the counter 33 is cleared. In this example, the counter 33 is assumed to be a 2-bit counter.

Since the two input to the OR gate 30, that is, the flag and the cks signal, indicate L, the signal EN becomes L at the falling edge of the subsequent clock $\phi$, that is, at time $t_{10}$.

In FIG. 7, using the cks expanding unit 27 configured by the counter 33, although it is possible to delay the recovery to the original value of the clock until a certain time has passed, that is, the counter 33 overflows even after the value of the flag drops to L, the operation can be realized by switching a clock at the falling edge of the machine clock $\phi$ immediately after the value of the flag becomes L as a result of determining that there is a margin at the time $t_7$ shown in FIG. 8 without using the counter 33. When the frequency of a clock is high, the time is naturally shortened, but it is effective to prevent unnecessary iterations of clock switch. In FIG. 7, clock switch timing is adjusted using a read strobe signal. However, the read strobe signal can be replaced with an address latch enale signal. The address latch enable signal is a signal indicating, for example, the period of fetching an address when data is read or written to the memory, and when a marginless status determination is made in bus data reading and writing operations as in the eighth embodiment described later, the address latch enable signal can also be used.

Figure 9:
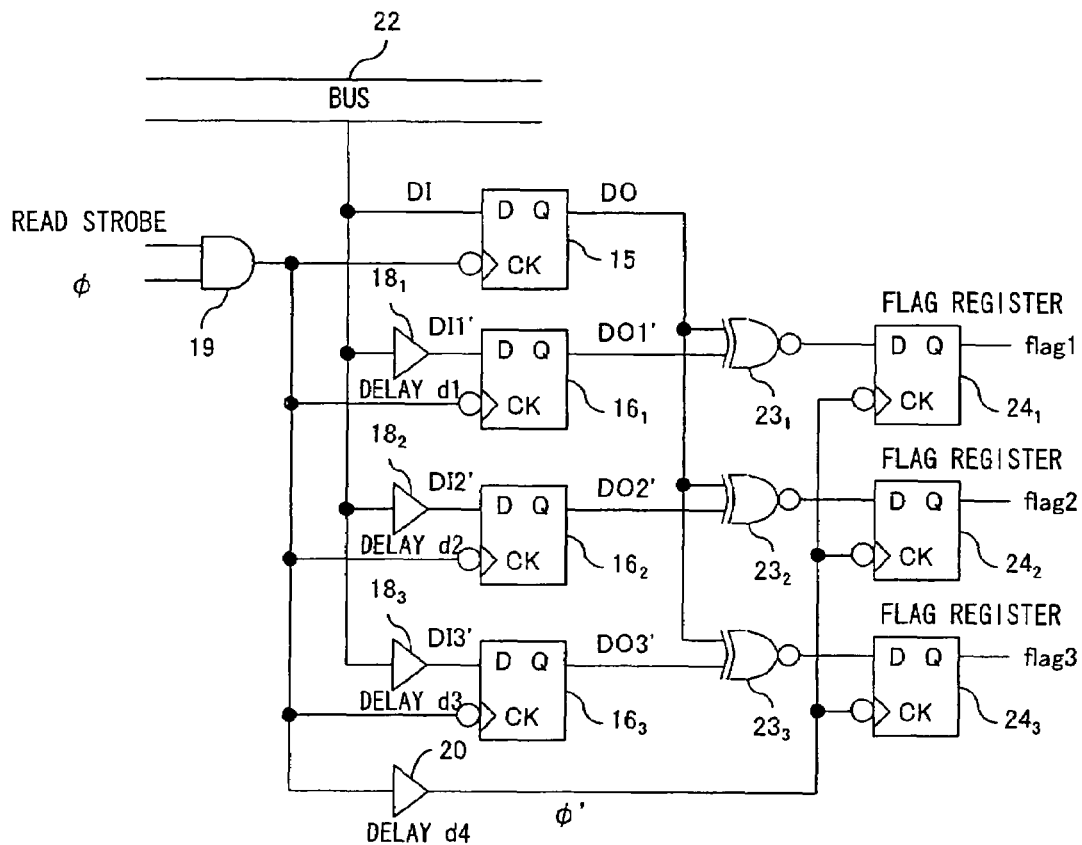
FIG. 9 is a block diagram of the configuration of the marginless status determination circuit according to a third embodiment of the present invention.

FIG. 9 is a block diagram of the configuration of the marginless status determination circuit according to a third embodiment of the present invention. When FIG. 9 is compared with FIG. 5 showing the first embodiment, three units of each component, that is, the delay cells $18_1$, to $18_3$, the registers $16_1$ to $16_3$, the EXNOR gates $23_1$ to $23_3$, and the flag registers $24_1$ to $24_3$ can be provided. By setting three values for the amounts of delay d1 to d3 by the delay cells $18_1$ to $18_3$, the marginless status determination can be made on different margins. The amount of delay can be d1 as the minimum value, and d2 and d3 as increasing values in this order.

FIG. 10 shows the configuration of the clock switch circuit according to the third embodiment of the present invention. FIG. 10 shows the configuration of the clock switch circuit in which three flags for the configuration of the marginless status determination circuit shown in FIG. 9, that is, one of the four clock signals $\phi1$ to $\phi4$ for the values of the flags 1 to 3, is output as clock signal $\phi a$. The configuration basically includes three sets of the clock switch timing adjustment unit in the clock switch circuit and the cks expanding unit explained above by referring to FIG. 7, and when the flag 3 once enters the H state, $\phi2$ is output as $\phi a$ if the signal cks1 indicates H, $\phi3$ is output as $\phi a$ when the signal cks2 indicates H if both flags 3 and 2 indicate H, and $\phi4$ is output as $\phi a$ when the signal cks3 indicates H if the flags 3 through 1 all indicate H. In other cases, $\phi1$ is output as $\phi a$. The frequency of the clock is $\phi4$ at minimum, and increases with $\phi3$, $\phi2$, and $\phi1$ in this order.

Figure 11:
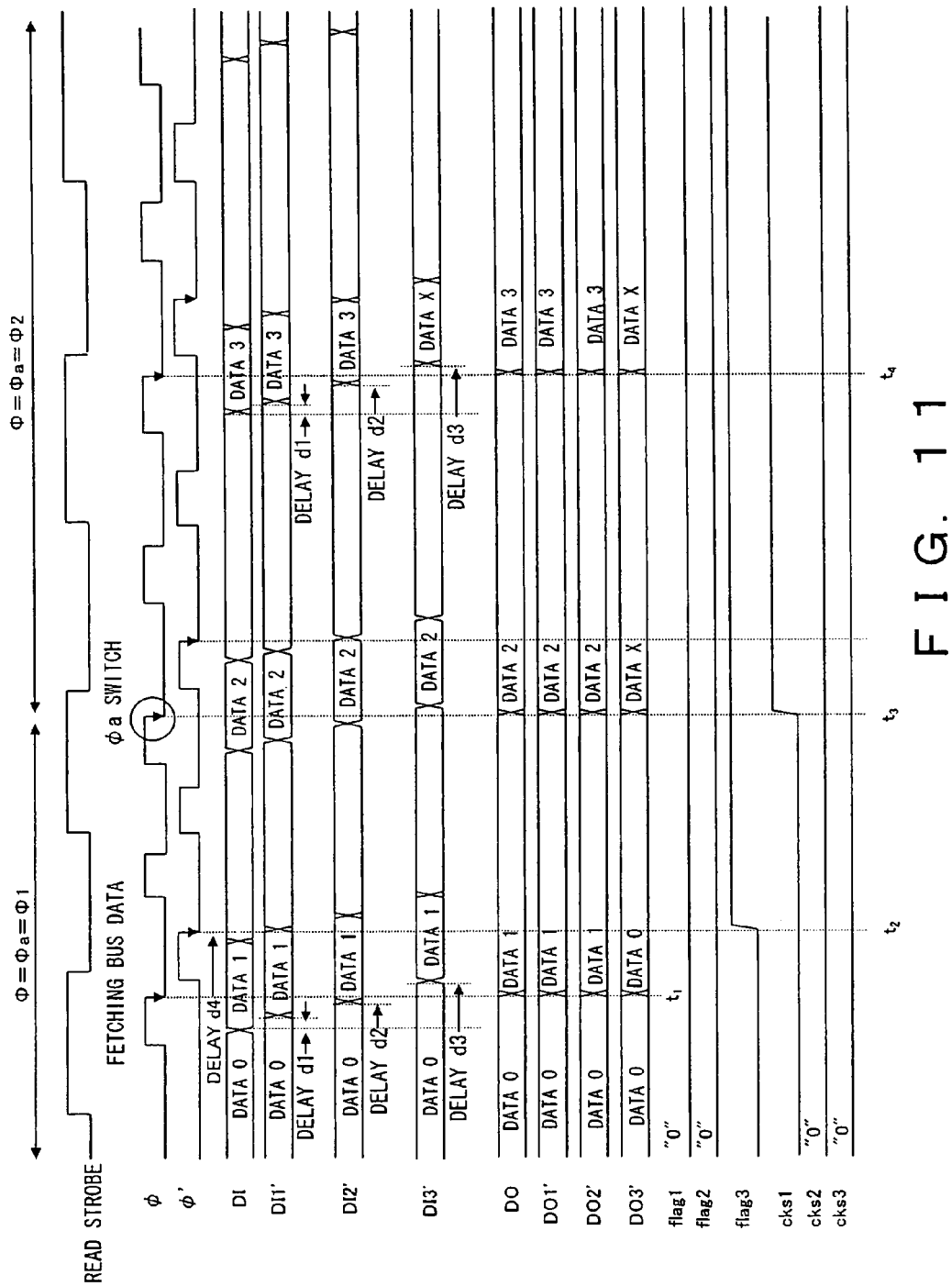
FIG. 11 is a time chart of an example (1) of a marginless status determining operation according to the third embodiment of the present invention.
Figure 12:
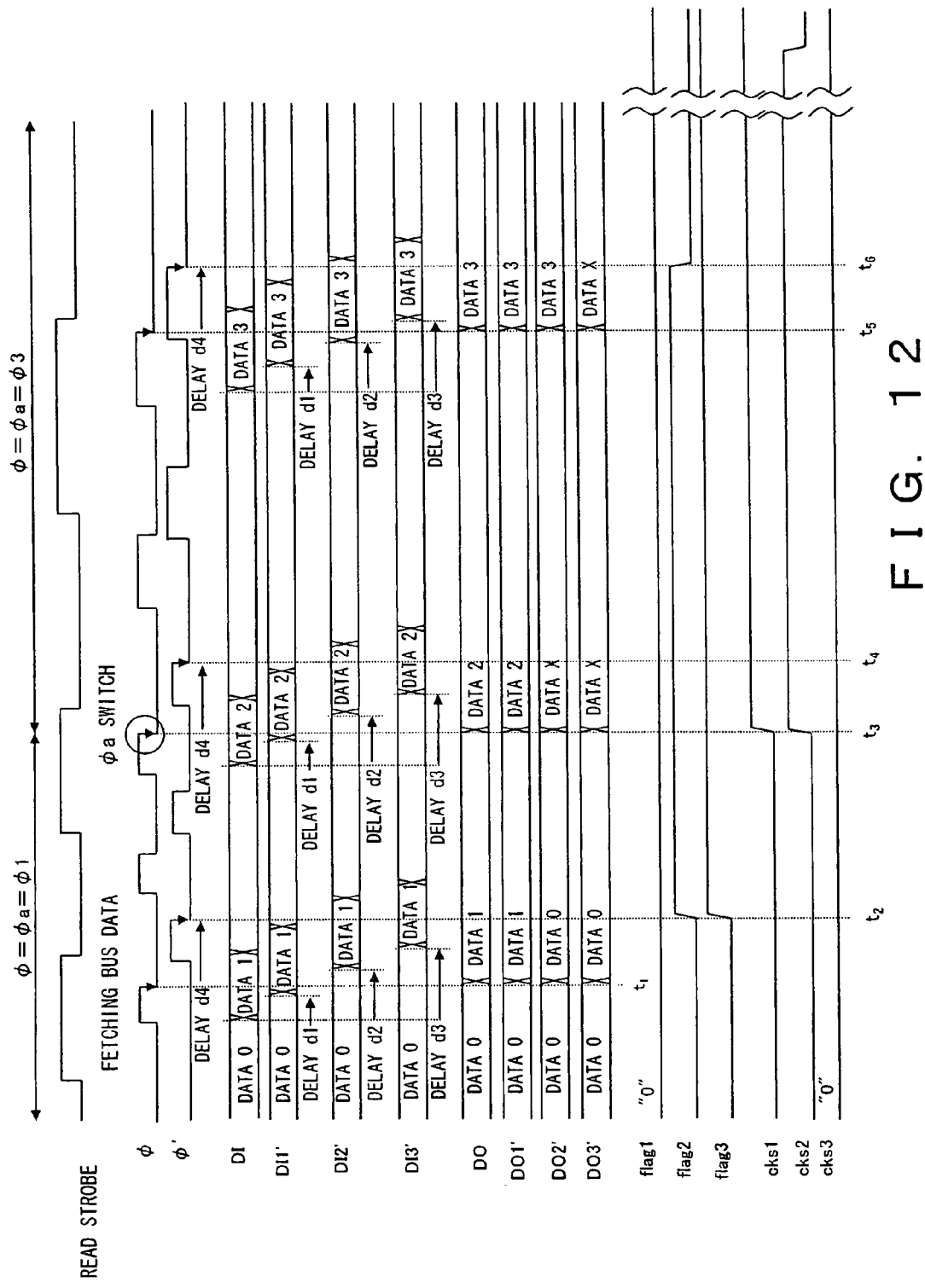
FIG. 12 is a time chart of an example (2) of a marginless status determining operation according to the third embodiment of the present invention.
Figure 13:
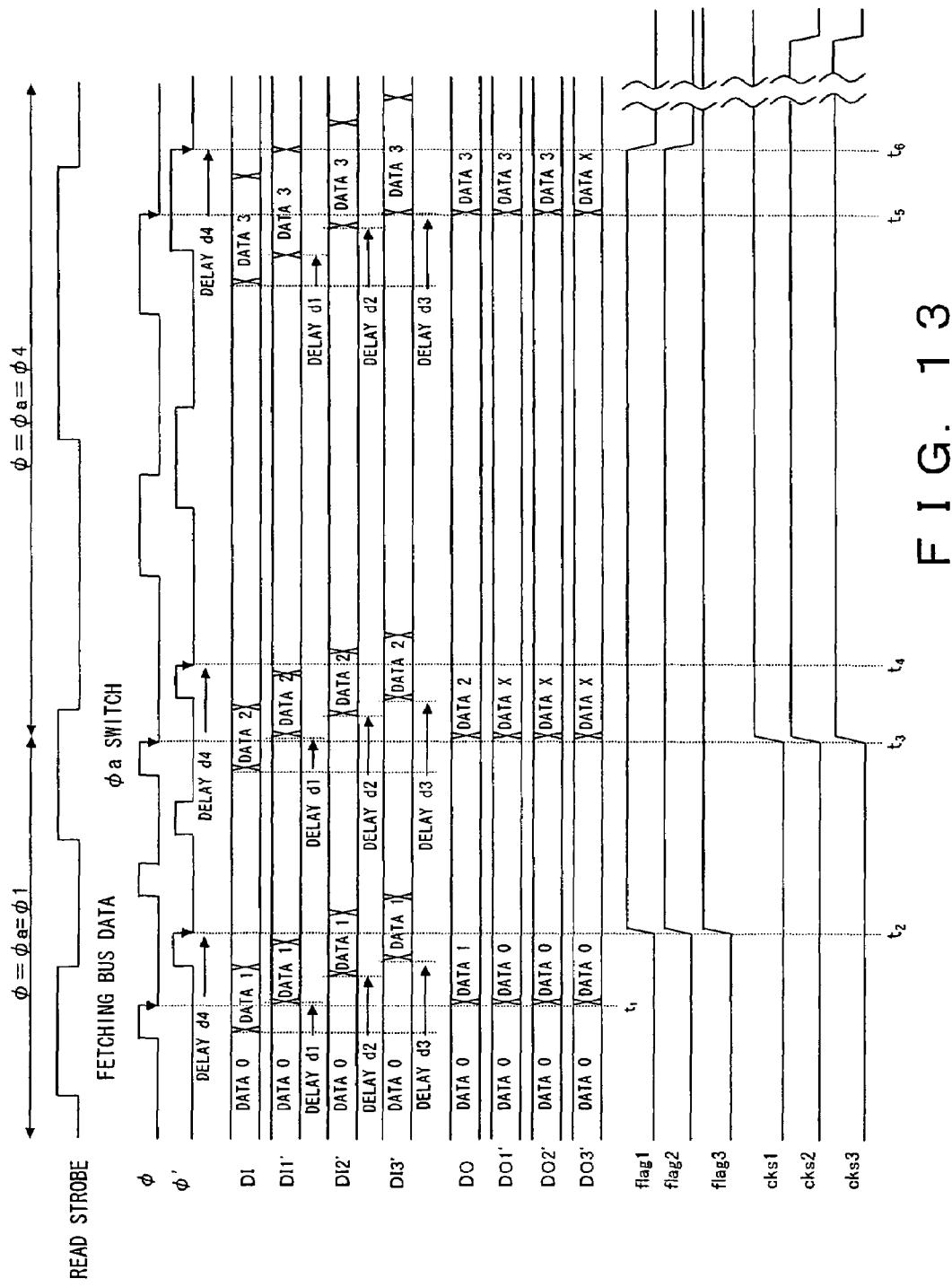
FIG. 13 is a time chart of an example (3) of a marginless status determining operation according to the third embodiment of the present invention.

FIGS. 11 through 13 are time charts showing examples of operations according to the third embodiment. FIG. 11 is a time chart of an example (1) of the operation. Only the flag 3 in the flags output by each of the three flag registers $24_1$, through $24_3$; indicates H, and shows an example of a switch from $\phi1$ to $\phi2$ in the four clock signals shown in FIG. 10.

In FIG. 11, at the time point $t=t_1$, when bus data is fetched in the period of the first H of the read strobe signal, data is fetched to each of the three registers $16_1$, $16_2$, and $16_3$. However since the amount of delay d3 of data for the register $16_3$ is large, only the data DI3' fetched to the register $16_3$ is data 0, and is different from the data in the other registers, that is, the data 1. As a result, at the marginless status determination time $t=t_2$, only the flag 3 output by the flag register $24_3$ indicates H.

Then, when the next read strobe signal indicates H, the clock selection signal cks1 shown in FIG. 10 at the negative edge of the machine clock $\phi$ becomes H, a clock switch is performed at $t=t_3$, and then the machine clock $\phi$ changes from $\phi1$ to $\phi2$. Then, in the period of H of the subsequent read strobe signal, the marginless status determination is made again at $t=t_4$. Assuming that, in this determination again, only the data fetched by the register $16_3$ is still different, a machine clock $\phi2$ is continuously used.

If the data fetched to the register $16_3$ becomes the same as the data fetched to other registers, the system clock is naturally switched to $\phi1$. In FIG. 11, since the flag 3 remains in the H state although the system clock is switched to $\phi2$, a switch to a clock signal $\phi3$ of a further lower frequency can be considered. However, assuming that the amount of delay d3 by the delay cell $18_3$ is sufficiently large and it is not necessary to use a larger margin, the clock is not switched any more in this example.

FIG. 12 is a time chart of an example (2) of a marginless status determining operation according to the third embodiment of the present invention. FIG. 12 is a time chart of an example in which the flags 2 and 3 output by the flag registers $24_2$ and $24_3$ indicate H in the three flag registers $24_1$ through $24_3$ shown in FIG. 9.

In FIG. 12, data is fetched to each register at the time $t=t_1$. At this time, the data 1 is fetched to the registers 15 and $16_1$, and the data 0 is fetched to the registers $16_2$ and $16_3$. As a result, at the negative edge of the delay clock $\phi'$, that is, at the time $t=t_2$;, the flags 2 and 3 indicate H. Then, at the negative edge of the clock $\phi$ in the period of H of the subsequent read strobe signal, that is, at $t=t_3$, the clock selection signals cks1 and cks2 indicate H, by cks2 indicating H, thereby switching the clock $\phi$ from $\phi1$ to $\phi3$, that is, to a clock of frequency lower by two levels. At the time $t=t_4$, a marginless status determination is made again. However, since the data fetched to the registers $16_2$ and $16_3$ is the data X as an inconstant value and is different from the data 2 fetched to the registers 15 and $16_1$, thereby continuing the value of H for the flags 2 and 3.

Afterwards, at the time $t=t_5$ in the period of H of the subsequent read strobe signal, data is fetched to each register. At this time, only the data fetched to the register $16_3$ is the data x as an inconstant value, and at the subsequent marginless status determination time $t=t_6$, the flag 2 output by the flag register $24_2$ changes from H to L. However, the flag 3 output by the flag register $24_3$ remains H. After the flag 2 changes to L, the clock selection signal cks 2 enters the L state after a predetermined time as described above. Afterwards, the clock $\phi$ returns to $\phi2$.

FIG. 13 is a time chart of an example (3) of a marginless status determining operation according to the third embodiment of the present invention. FIG. 13 is a time chart of an example in which all three flags output by the three flag registers $24_1$ through $24_3$ shown in FIG. 9 indicate H.

In FIG. 13, at the time $t=t_1$, data is fetched to a register. At this time, assuming that the data fetched to the register 15 is data 1, and the data fetched to the other three registers $16_1$ through $16_3$ is data 0, the flags output by the three flag registers at the marginless status determination $t=t_2$ indicate all H. Then, clocks are switched at $t=t_3$, and the clock signal $\phi$ is switched to the clock ϕ4 having the lowest frequency. In the marginless status determination at the time t=t$_4$, the data of the register 15 and the other three registers 16$_1$ through 16$_3$ are different, and the flags 1 through 3 continuously indicate the value of H.

After the clock is switched to ϕ4, in the data fetched to each register at the tome t=t$_5$, the data fetched to the registers 16$_1$ and 16$_2$ is the same as the data fetched to the register 15, the values of the flags 1 and 2 are L at the time t=t$_6$. Then, by the clock selection signals cks2 and cks3 indicating L, the machine clock ϕ is switched to ϕ2.

Figure 14:
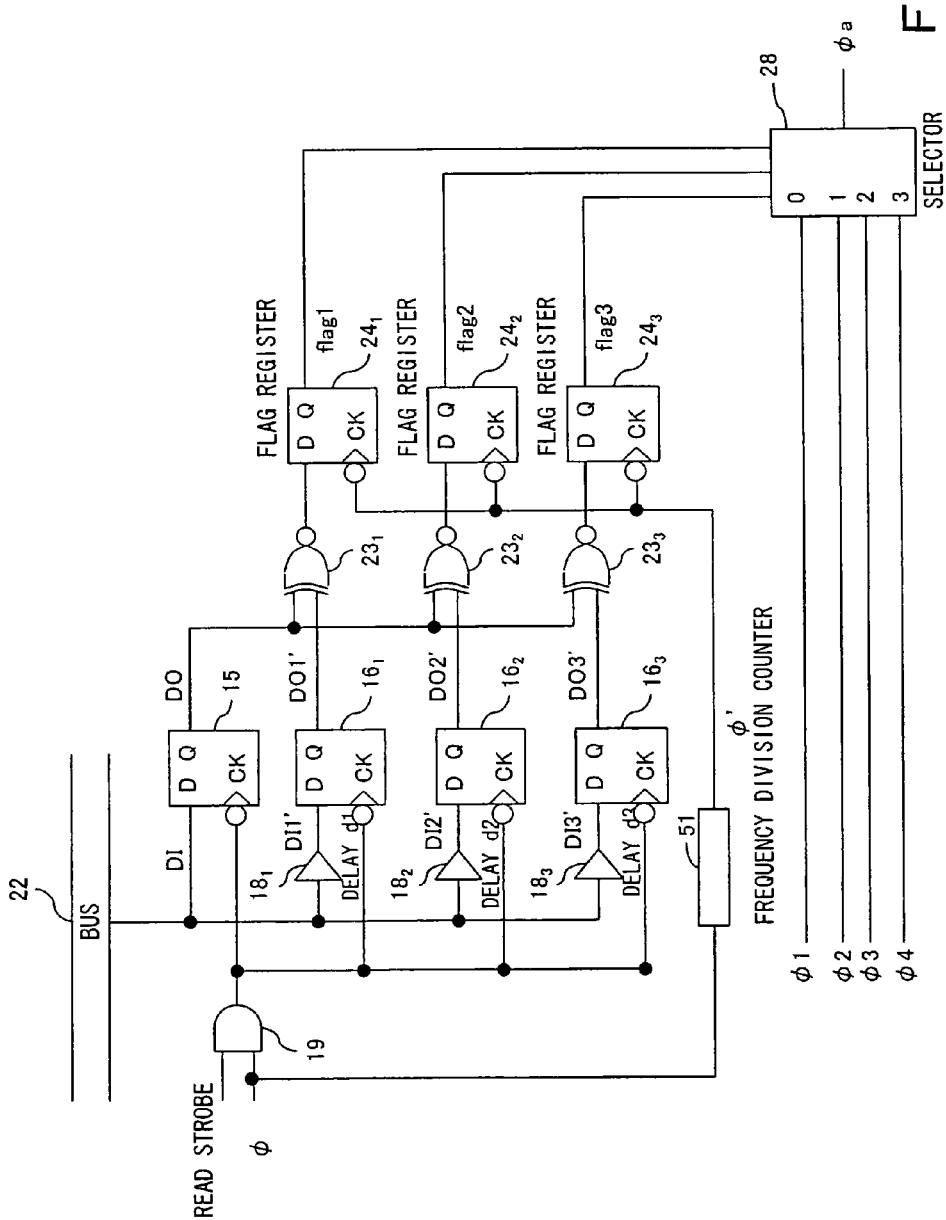
FIG. 14 is a block diagram of the configuration of the marginless status determination circuit and the clock switch circuit according to a fourth embodiment of the present invention.
Figure 15:
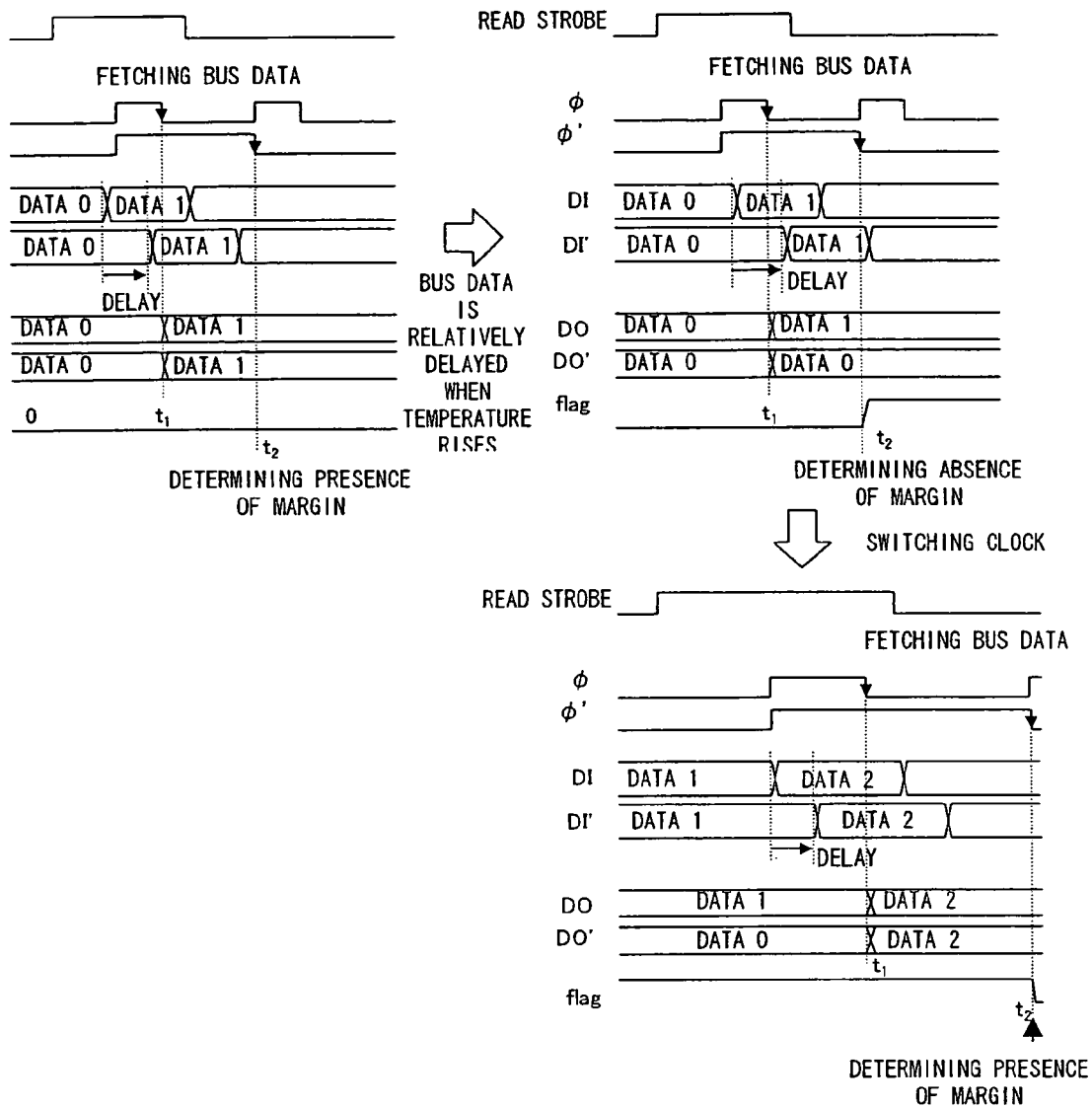
FIG. 15 is a time chart of an example of a marginless status determining operation according to the fourth embodiment of the present invention.

Described below is the fourth embodiment of the present invention. FIG. 14 is a block diagram of the configuration of the marginless status determination circuit and the clock switch circuit according to a fourth embodiment of the present invention. FIG. 15 is a time chart of an example of a marginless status determining operation according to the fourth embodiment of the present invention.

When the configuration of the marginless status determination circuit shown in FIG. 14 is compared with that shown in FIG. 9 according to the third embodiment, the delay cell 20 connected to the clock input terminal of the flag registers 24$_1$ through 24$_3$ can be replaced with a frequency division counter 51, and the machine clock ϕ is provided for the frequency division counter 51 instead of the output of the AND gate 19.

That is, in FIG. 14, as compared with FIG. 9 in which a marginless status determination is made at the negative edge of the delay clock signal ϕ' which delays the machine clock ϕ, a marginless status determination is made at the negative edge of the frequency division clock ϕ' as a result of frequency-dividing the machine clock ϕ. To the selector 28 as a clock switch circuit shown in FIG. 14, the values of the flags output by the flag registers 24$_1$ through 24$_3$ are supplied unlike the third embodiment, and the clock is switched depending on the flag output value.

As compared with the time chart shown in FIG. 6 according to the first embodiment, in the operation time chart shown in FIG. 15, the marginless status determination is performed at the negative edge of the delay clock ϕ' in FIG. 6. In FIG. 15, it is performed at the negative edge of the frequency division clock ϕ'. The other operations are basically the same, and the detailed explanation is omitted here.

Figure 16:
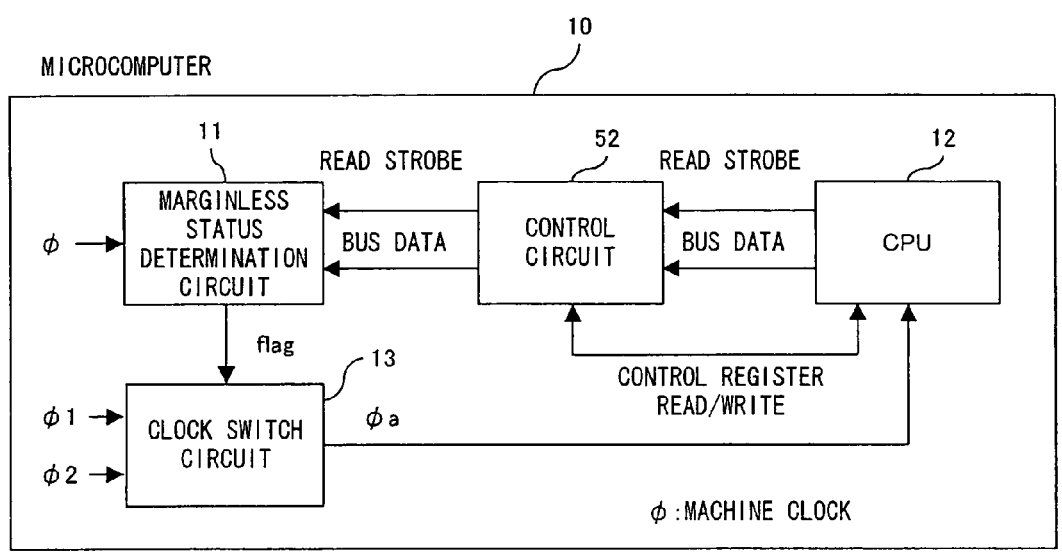
FIG. 16 is an explanatory view showing the marginless status determination system according to the fifth embodiment of the present invention.

The fifth embodiment of the present invention is explained below by referring to FIGS. 16 and 17. FIG. 16 is a block diagram of the configuration of the microcomputer according to the fifth embodiment of the present invention. As compared with FIG. 2 which is the block diagram of the basic configuration, a control circuit 52 is provided between the CPU 12 and the marginless status determination circuit 11. The control circuit 52 controls the start/stop of the operation of the marginless status determination circuit 11, that is, the marginless status determining operation to determine whether or not a marginless status determination is to be made, and the control is performed by providing or not providing a read strobe signal received from the CPU 12 for the marginless status determination circuit 11. According to the present invention, For example, as explained above by referring to FIG. 6, the marginless status determining operation is performed corresponding to the read strobe signal. When the read strobe signal is not provided for the marginless status determination circuit 11, the operation of the marginless status determination circuit 11 is stopped.

The control circuit 52 comprises a control register for controlling the start/stop of the operation of the marginless status determination circuit 11. By the CPU 12 enabling data to be read/written on the control register, for example, a control register is rewritten corresponding to the instruction given in a program from a user to the CPU 12. Using the contents of the control register as a result, the control circuit 52 controls the start/stop of the operation of the marginless status determination circuit. It is obvious that the control circuit 52 can be incorporated in the CPU 12.

FIG. 17 is a block diagram of the configuration of the control circuit 52 shown in FIG. 16. The control 25 circuit 52 provides a read strobe signal received from the CPU 12 for the marginless status determination circuit 11 as is when the operation of the marginless status determination circuit 11 is permitted, and controls not to provide a read strobe signal for the marginless status determination circuit 11 when the operation of a determination circuit is not permitted. In FIG. 17, an address decoder 55 designates a control register 57 storing data indicating permission/rejection of the operation of the marginless status determination circuit. When the output of the address decoder 55 and the write strobe signal for a write of data to the control register 57 are provided for an AND gate 56, the output of the AND gate 56 is supplied to the clock input terminal of the control register 57, and the data of permission/rejection of the operation of the determination circuit assigned to one bit of the bus is fetched to the control register 57. When the data is "1", the read strobe signal from the CPU 12 is output to the marginless status determination circuit 11 through an AND gate 58.

Figure 18:
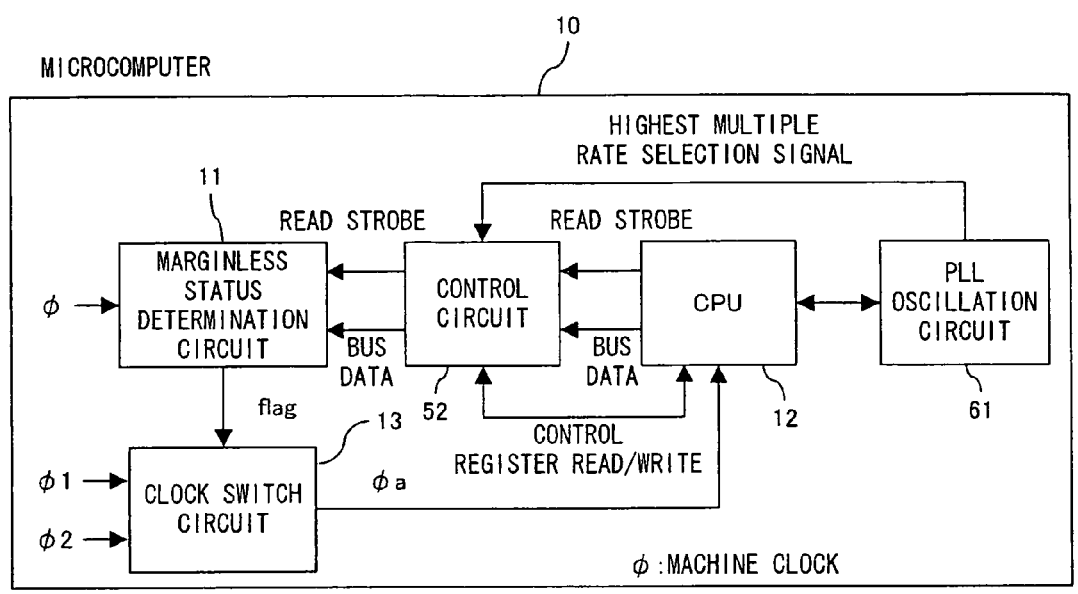
FIG. 18 is an explanatory view of the marginless status determination system in a case where a PLL oscillation circuit is used.

FIG. 18 is an explanatory view showing the use of a PLL multiple rate selection signal according to the fifth embodiment of the present invention. In FIG. 18, a PLL oscillation circuit 61 provides a high frequency signal for the CPU 12, and when the PLL oscillation circuit 61 selects the highest multiple rate, the highest multiple rate selection signal indicating the selection is provided for the control circuit 52, and only when the highest frequency multiplication rate selection signal is input, the control circuit 52 performs control to allow the marginless status determination circuit 11 to perform an operation.

Figure 19:
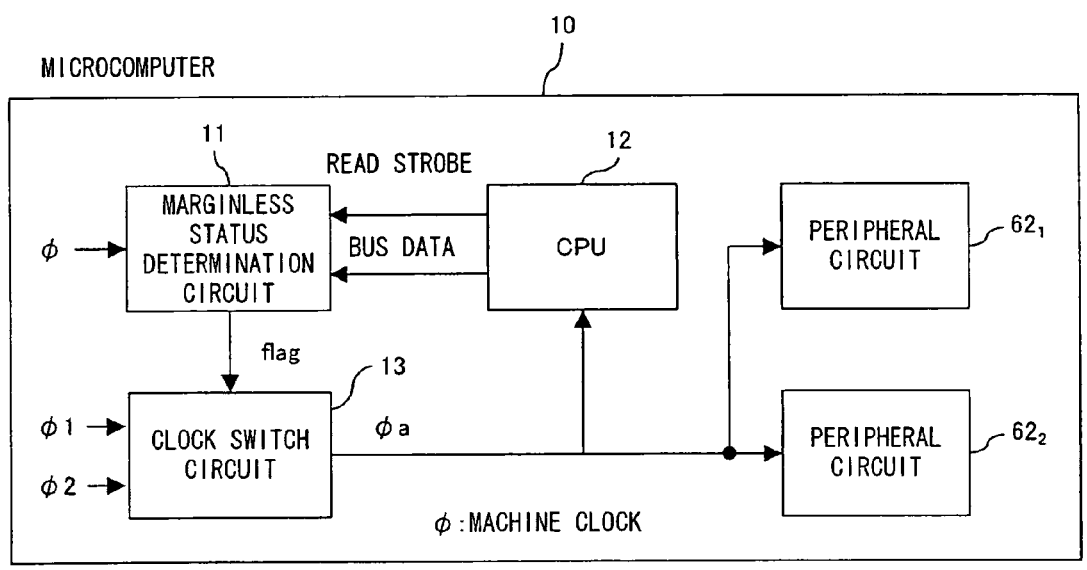
FIG. 19 is an explanatory view showing the output to a peripheral circuit as a result of switching a clock in the sixth embodiment of the present invention.

FIG. 19 is a block diagram of the configuration of the microcomputer according to the sixth embodiment of the present invention. As explained above by referring to FIG. 2, when the marginless status determination circuit 11 outputs a flag indicating a marginless status to the clock switch circuit 13 according to the present embodiment, a switch is made to some of a plurality of clocks input to the clock switch circuit 13, and the output ϕa of the clock switch circuit 13 is used as the machine clock ϕ. However, the machine clock is provided not only for the CPU 12 in FIG. 19, but also for normally a plurality of peripheral circuits 62$_1$ and 62$_2$ in the microcomputer 10, and the clock of a switch result is provided for a peripheral circuit as a machine clock.

Figure 20:
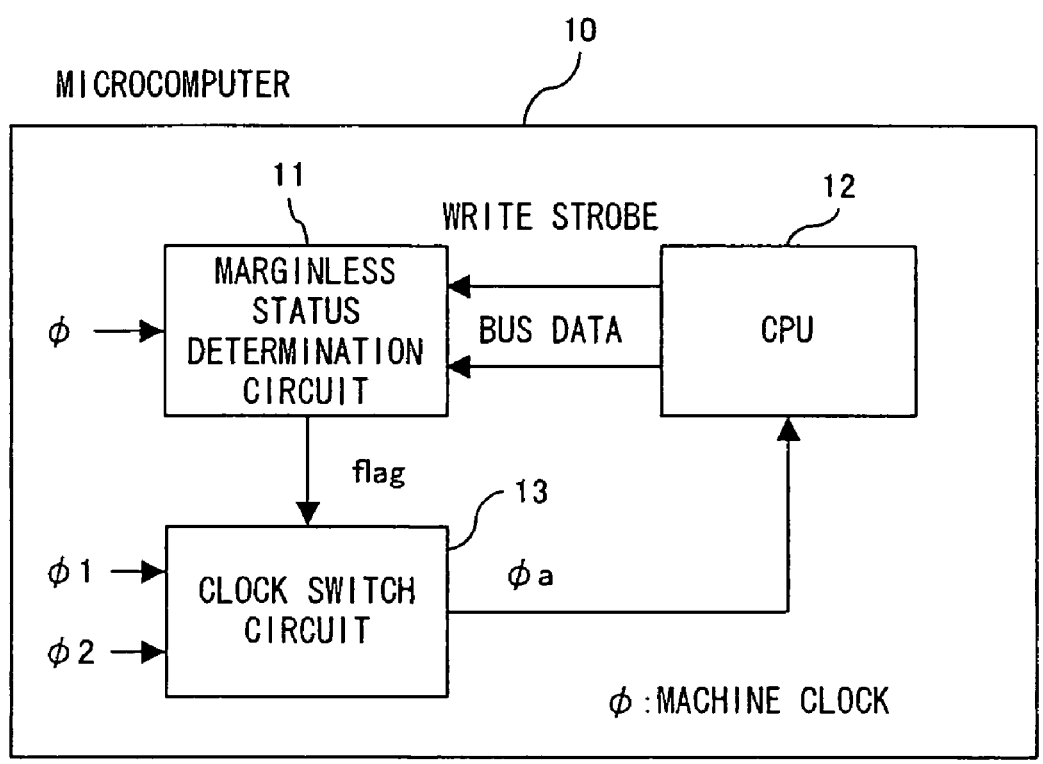
FIG. 20 is an explanatory view showing the marginless status determination system according to the seventh embodiment of the present invention.

FIG. 20 is an explanatory view of the marginless status determination system according to the seventh embodiment of the present invention. As explained by referring to FIG. 2, according to the first through sixth embodiments, the CPU 12 provides a read strobe signal for the marginless status determination circuit 11, and a marginless status determination is made on a delay of bus data in a data reading operation, for example, when data is read from memory. In FIG. 20, the CPU 12 provides a write strobe signal together with bus data for the marginless status determination circuit 11. For example, a marginless status determination is made in the data writing operation to memory.

Finally, the eighth embodiment is explained below by referring to FIGS. 21 through 23. In the eighth embodiment, unlike the first through the seventh embodiments, in reading and writing data, a marginless status determination is made to bus data.

Figure 21:
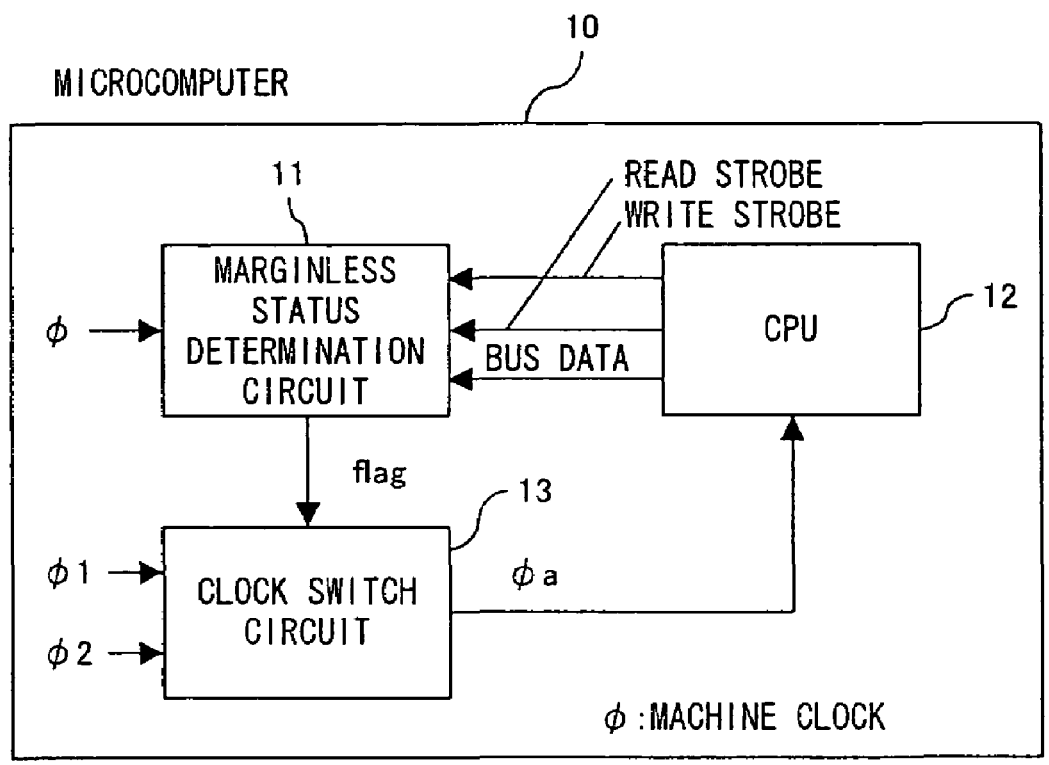
FIG. 21 is an explanatory view showing the marginless status determination system according to the eighth embodiment of the present invention.

FIG. 21 is an explanatory view of the marginless status system according to the eighth embodiment of the present invention. In FIG. 21, the CPU 12 provides both read strobe signal and write strobe signal for the marginless status determination circuit 11 together with bus data, and the marginless status determination circuit 11 makes a marginless status determination on the bus data in bogh data reading operation and data writing operation.

Figure 22:
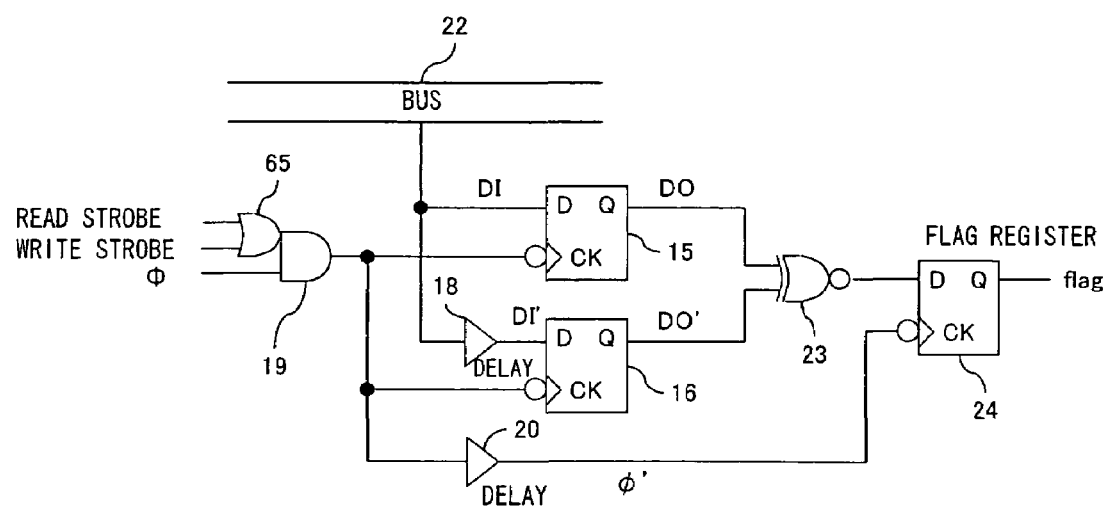
FIG. 22 is a block diagram of the configuration of the marginless status determination circuit according to as eighth embodiment of the present invention.

FIG. 22 is a block diagram of the configuration of the marginless status determination circuit 11 according to the eighth embodiment of the present invention. When FIG. 22 is compared with FIG. 5 according to the first embodiment, an OR gate 65 for inputting a read strobe signal and a write strobe signal is added at the stage before the AND gate 19 to which a read strobe signal and a machine clock φ are input in FIG. 5, and the output of the OR gate 65 is input to the AND gate 19 together with the machine clock φ.

Figure 23:
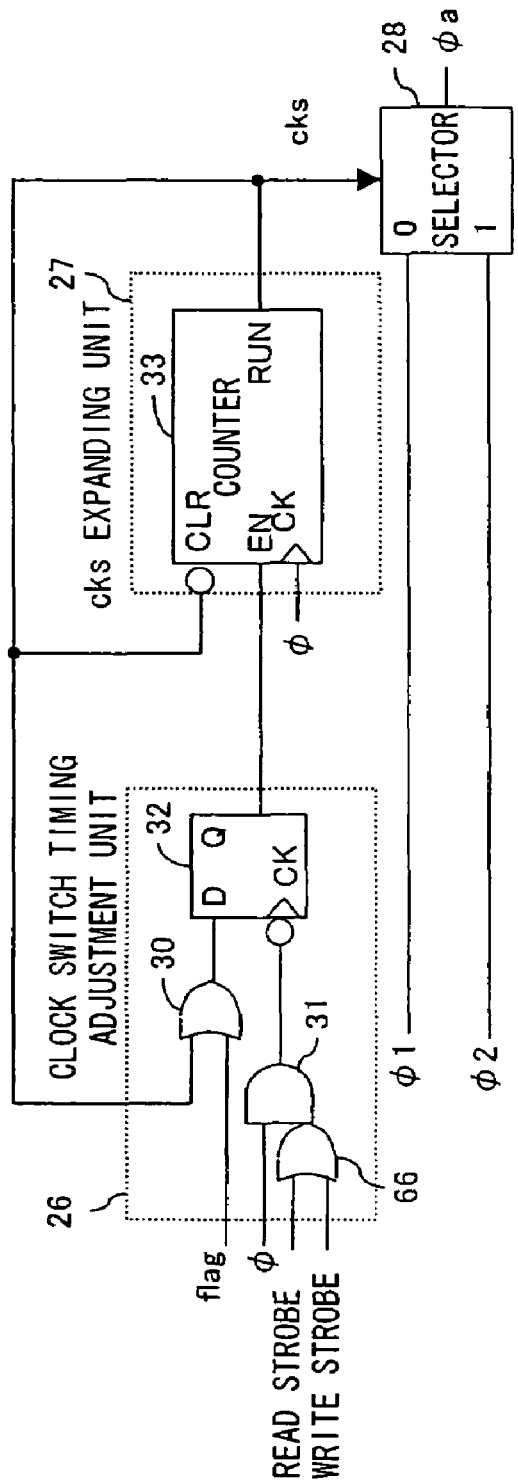
FIG. 23 is a block diagram of the configuration of the clock switch circuit according to the eighth embodiment of the present invention.

FIG. 23 is a block diagram of the configuration of the clock switch circuit according to the eighth embodiment of the present invention. When FIG. 23 is compared with FIG. 7 according to the second embodiment, an OR gate 66 in which a read strobe signal and a write strobe signal are input to the clock switch timing adjustment unit 26, and the output is supplied as one input to the AND gate 31 is added.

What is claimed is:

1. A determination circuit which determines presence/absence of a margin of a data delay, comprising:
    a first data storage unit storing data;
    a data delay unit delaying the data;
    a second data storage unit storing output of the data delay unit; and
    a comparison unit comparing storage contents of the first data storage unit with storage contents of the second data storage unit, and outputting a marginless status detection signal when the contents are different;
    wherein the marginless status detection signal output by the comparison unit is used as a switch control signal to a clock switch circuit; and
    a clock signal switched by the clock switch circuit, depending on input of the marginless status detection signal, is provided for a central processing device of a microcomputer.

2. The circuit according to claim 1, further comprising
    a counter unit for instructing the clock switch circuit, when the clock switch circuit switches a clock depending on output of the marginless status detection signal, to recover to a clock before the switch.

3. The circuit according to claim 1, wherein
    the switched clock signal is further provided for a peripheral circuit of a central processing device in the microcomputer.

4. The circuit according to claim 1, wherein
    the determination circuit operates in a data reading operation in a computer, and the data is read data on a bus.

5. The circuit according to claim 1, wherein
    the determination circuit operates in a data storing operation in a computer, and the data is write data on a bus.

6. The circuit according to claim 1, wherein
    the determination circuit operates in a data reading operation and a data writing operation in a computer, and the data is read data or write data on a bus.

7. The circuit according to claim 1, further comprising
    a control circuit controlling start/stop of a determining operation in response to an external instruction on the determination circuit.

8. The circuit according to claim 7, wherein
    the control circuit is incorporated into a central processing device of a microcomputer.

9. The circuit according to claim 7, wherein
    the control circuit instructs a central processing device of the microcomputer to start the marginless status determining operation upon receipt of a signal indicating that a highest multiple rate has been selected in an oscillator for providing a PLL signal.

10. A determination circuit which determines presence/absence of a margin of a data delay, comprising:
    a data storage unit storing data;
    a plurality of data delay units delaying the data by respective different delay times;
    a plurality of delay data storage unit respectively storing output of the plurality of date delay units;
    a plurality of comparison units comparing respective storage contents of the plurality of delay data storage units with respective storage contents of the data storage units, and outputting a nonmatching detection signal when the storage contents are different; and
    a clock switch unit switching clock signals having different frequencies based on an output value of the plurality of comparison units;
    wherein a clock signal switched by the clock switch circuit is provided for a central processing device of a microcomputer.

11. The circuit according to claim 10, wherein
    the clock switch unit stepwise switches a plurality of clock signals different in frequency from a high frequency to a low frequency depending on a value of output of the plurality of comparison units.

* * * * *

UNITED STATES PATENT AND TRADEMARK OFFICE
CERTIFICATE OF CORRECTION

PATENT NO. : 7,454,649 B2 Page 1 of 1
APPLICATION NO. : 11/238957
DATED : November 18, 2008
INVENTOR(S) : Kenji Yoshida et al.

It is certified that error appears in the above-identified patent and that said Letters Patent is hereby corrected as shown below:

Column 12, Line 30, change "date" to --data--.

Signed and Sealed this

Tenth Day of February, 2009

JOHN DOLL
*Acting Director of the United States Patent and Trademark Office*